United States Patent
Matsuoka et al.

(10) Patent No.: US 6,369,511 B1
(45) Date of Patent: Apr. 9, 2002

(54) TRAVELLING-WAVE TUBE AMPLIFIER

(75) Inventors: Jun' ichi Matsuoka; Kouji Okamoto; Junichi Kobayashi, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/432,174

(22) Filed: Nov. 2, 1999

(30) Foreign Application Priority Data

Nov. 2, 1998 (JP) .......................................... 10-312012

(51) Int. Cl.[7] ................................................ H01J 25/34
(52) U.S. Cl. ......................... 315/3.5; 315/5.38; 330/43
(58) Field of Search ................. 315/5.38, 3.5; 330/43

(56) References Cited

U.S. PATENT DOCUMENTS 4,777,406 A * 10/1988 Ross et al. ................ 315/3.5

FOREIGN PATENT DOCUMENTS

| JP | 116002 | * 10/1978 | ................ 315/5.38 |
| JP | 60-12590 | 1/1985 | |
| JP | 4-32003 | 2/1992 | |
| JP | 8-46808 | 2/1996 | |

* cited by examiner

Primary Examiner—Benny T. Lee
(74) Attorney, Agent, or Firm—Sughrue Mion, PLLC

(57) ABSTRACT

A travelling-wave tube amplifier comprises a travelling-wave tube, a plurality of collector electrodes, a plurality of collector leads and at least one magnetic core. The travelling-wave tube causes interaction between an electron beam and an input high frequency signal to amplify the high frequency signal, and outputs the amplified high frequency signal. The plurality of the collector electrodes capture the electron beam which was subjected to velocity modulation by the interaction. The plurality of the collector electrodes are electrically connected to a power source via the plurality of the collector leads. The at least one magnetic core comprises a through hole. Any two of the plurality of the collector leads go through the through hole in one of the magnetic cores. Currents flowing through the two collector leads through the through hole in the magnetic core generate magnetic fluxes in the magnetic core. The directions of the generated magnetic fluxes are reversed from each other.

15 Claims, 2 Drawing Sheets

TRAVELLING-WAVE TUBE AMPLIFIER

BACKGROUND OF THE INVENTION

1. Field of the Invention

The present invention relates to a travelling-wave tube amplifier suitable for amplifying microwaves, more particularly to a travelling-wave tube amplifier using a multi-stage collector type travelling-wave tube.

2. Description of the Related Art

Digital communication technology has been spread widely in the recent telecommunications field instead of analog communication technology. In the digital communication system, usually one amplifier simultaneously amplifies a plurality of signal waves (so called, multi-carrier) whose frequencies are slightly different from each other. Such multi-carrier amplification is a popular technique for digital communications, and requires many amplifiers for high frequency such as those frequencies in a microwave band. A travelling-wave tube amplifier is suitable for such a high frequency amplifier. The typical travelling-wave tube amplifier comprises a travelling-wave tube having an electron gun, a high frequency circuit, collector electrodes, and a power source for driving the travelling-wave tube.

Generally, the travelling-wave tube amplifier employs a multi-stage collector type travelling-wave tube. In such the multi-stage collector type travelling-wave tube, multiple collector electrodes are prepared in order to sequentially reduce potentials at each collector electrode. As a result, the travelling-wave amplifier realizes improved energy conversion.

In the high frequency circuit, an electron beam emitted from the electron gun interacts with a high frequency signal. Energy of the electron beam amplifies the high frequency signal. Then the electron beam goes toward the collector electrodes. Each of the electrons in the electron beam is captured by the collector electrodes. The relationship between an electron and collector electrode that capture the electron depends on energy condition of each electron. Since the electron beam is subjected to velocity modulation in the high frequency circuit, a collector current includes a direct current component and a modulated current component. The modulated current component returns to the power source via collector leads. The modulated current component in the collector current is an unnecessary component for the power source. In other words, the power source regards the modulated current component as ripple.

In a case where the travelling-wave tube amplifier amplifies a plurality of signal waves for the multi-carrier amplification, distortion waves caused by non-linearity of the travelling-wave tube amplifier appear. Intermodulation waves also appear. Frequency components in the intermodulation waves correspond to a frequency difference between two signal waves of the plurality of signal waves. Since a given frequency interval in the plurality of signal waves to be amplified is in the range from several kHz to tens of MHz in accordance with the applied communication system, the intermodulation waves have the frequency component in the range from several kHz to tens of MHz. Accordingly, the modulated current component in the collector current is also in the range from several kHz to tens of MHz.

The modulated current component returns to the power source. When the frequency component of the intermodulation waves is synchronous with an unstable zone of the power source, irregular phenomenon such as oscillation occur. Such unstable phenomenon in the power source prevent regular high frequency amplification, that is, unstable amplification. Moreover, the travelling-wave tube amplifier may be damaged if an irregular voltage is applied thereto. Accordingly, the unstable phenomenon in the power source disturb regular functions of the travelling-wave tube amplifier.

In other technical fields, various techniques regarding to restraining unnecessary components have been proposed. For example, Unexamined Japanese Patent Application KOKAI Publication No. H8-46808 discloses a technique for canceling unnecessary pulses in a high voltage generator circuit for a CRT (Cathode Ray Tube) display. Unexamined Japanese Patent Application KOKAI Publication No. H4-32003 discloses a noise reduction technique for a multi-track tape recorder, which reduces low frequency (equal to or lower than 360 Hz) noises plunged into wiring near the recorder's head. Unexamined Japanese Patent Application KOKAI Publication No. S60-12590 discloses a technique for offsetting crosstalk between channels in a magnetic recording/reproducing apparatus. The disclosures of the above Japanese Patent Applications are incorporated herein by reference in their entirety.

The techniques disclosed in Unexamined Japanese Patent Application KOKAI Publication Nos. H8-46808, H4-32003 and S60-125902 belong to a technical field that is inconsistent with the technical field for the present invention, travelling-wave tube amplifiers.

It is an object of the present invention to restrain unnecessary components which appear at every section from a travelling-wave tube to a power source for driving it.

It is another object of the present invention to enable a travelling-wave tube amplifier to be driven stably.

It is a further object of the present invention to provide excellent frequency characteristics with a travelling-wave tube amplifier.

SUMMARY OF THE INVENTION

To accomplish the above objects, a travelling-wave tube amplifier according to a first aspect of the present invention is a travelling-wave tube amplifier comprising:

a travelling-wave tube causing interaction between an electron beam and an input high frequency signal to amplify the high frequency signal and cause a velocity modulation of the electron beam, and outputting an amplified high frequency signal;

a plurality of collector electrodes capturing the electron beam, and being subjected to the velocity modulation of the electron beam;

a plurality of collector leads electrically connecting each of said collector electrodes to a power source; and at least one magnetic core comprising a respective through hole, wherein any two of the plurality of said collector leads pass through said through hole in one of said magnetic cores, and respective currents flowing through said two collector leads passing through said through hole in said magnetic core generate corresponding magnetic fluxes in said magnetic core with directions which are reversed from each other.

According to this structure, the magnetic fluxes, which are generated in the magnetic core and whose directions are reversed from each other, cause induction currents to flow through the two collector leads through the though hole in the magnetic core. The directions of those induction currents are reversed from the directions of the currents which originally flow through the two collector leads through the through hole in the magnetic core. Therefore, those induction currents restrain unnecessary components in the whole structure from the travelling-wave tube to the power source caused by the electron beam which was subjected to velocity modulation. As a result, the travelling-wave tube amplifier functions stably with excellent frequency characteristics.

In a first preferred embodiment for the travelling-wave tube amplifier according to the first aspect of the present invention, the power source applies a first voltage to an emission source of the electron beam, applies a voltage higher than the first voltage to one of said collector electrodes which is the furthest from said emission source of the electron beam, and sequentially applies higher voltages to respective ones of said collector electrodes closer to the emission source of the electron beam than said one which is the farthest. This structure has advantage that electrons in the electron beam, whose energy conditions are different from each other because the electron beam is subjected to velocity modulation, are fully captured in accordance with the energy conditions.

In a second preferred embodiment for the travelling-wave tube amplifier according to the first aspect of the present invention, two of the plurality of said collector leads pass through said magnetic core in opposite directions. This structure has the advantage that the directions of the magnetic fluxes generated in the magnetic core by the two collector leads are reversed from each other, because the directions of the currents flowing through the two collector leads through the through hole in the magnetic core are reversed from each other. This structure has advantage that the directions of the magnetic fluxes generated in the magnetic core by the two collector leads are reversed from each other, because the directions of the currents flowing through the two collector leads through the through hole in the magnetic core are reversed from each other.

In a third preferred embodiment for the travelling-wave tube amplifier according to the first aspect of the present invention, two of the plurality of the collector leads pass through the through hole in the magnetic core a predetermined number of times. This structure has advantage that the range of frequencies in unnecessary components is adjustable in accordance with how many times the collector leads go through the through hole. Thus, the unnecessary components can be restrained more effectively.

In a fourth preferred embodiment for the travelling-wave tube amplifier according to the first aspect of the present invention, the magnetic core has a ring-like cross section. This structure has advantage that unnecessary components can be restrained more effectively because the magnetic fluxes are generated efficiently.

In a fifth preferred embodiment for the travelling-wave tube amplifier according to the first aspect of the present invention, the magnetic core includes a ferrite member. This structure has advantage that the magnetic fluxes are generated in the magnetic core without failure because high frequency losses are reduced.

A travelling-wave tube amplifier according to a second aspect of the present invention is a travelling-wave tube amplifier comprising:

an electron gun emitting an electron beam;

a high frequency circuit causing interaction between the electron beam and an input high frequency signal to amplify the high frequency signal, subjecting the electron beam to a velocity modulation, and outputting an amplified high frequency signal;

a collector section including first and second collector electrodes for capturing the electron beam subjected to said velocity modulation;

first and second collector leads, each lead respectively having one end thereof being electrically connected with any one of said first and second collector electrodes while the other end thereof being electrically connected to a power source; and at least one magnetic core comprising a respective through hole, wherein each of said first and second collector leads passes through said through hole in one of said magnetic cores, and respective currents flowing through said first and second collector leads generate corresponding magnetic fluxes in said magnetic core with directions which are reversed from each other.

According to this structure, the magnetic fluxes, which are generated in the magnetic core and whose directions are reversed from each other, cause induction currents to flow through the two collector leads through the though hole in the magnetic core. The directions of those induction currents are reversed from the directions of the currents which originally flow through the two collector leads through the through hole in the magnetic core. Therefore, those induction currents restrain unnecessary components in the whole structure from the travelling-wave tube to the power source caused by the electron beam which was subjected to velocity modulation. As a result, the travelling-wave tube amplifier functions stably with excellent frequency characteristics.

In a first preferred embodiment for the travelling-wave tube amplifier according to the second aspect of the present invention, the power source applies a first voltage to said electron gun, applies a voltage higher than the first voltage to a furthest one of said collector electrodes which is further from said electron gun than any other collector electrode, and sequentially applies higher voltages to respective ones of said collector electrodes closer to said electron gun than said furthest one. This structure has advantage that electrons in the electron beam, whose energy conditions are different from each other because the electron beam is subjected to velocity modulation, are fully captured in accordance with the energy conditions.

In a second preferred embodiment for the travelling-wave tube amplifier according to the second aspect of the present invention, the first and second collector leads pass through said magnetic core in opposite directions. This structure has advantage that the directions of the magnetic fluxes generated in the magnetic core by the two collector leads are reversed from each other, because the directions of the currents flowing through the two collector leads through the through hole in the magnetic core are reversed from each other.

In a third embodiment for the travelling-wave tube amplifier according to the second aspect of the present invention, each of said first and second collector leads pass through said through hole in said magnetic core a predetermined number of times. This structure has the advantage that the range of frequencies in unnecessary components is adjustable in accordance with how many times the collector leads go through the through hole, thus, the unnecessary components can be restrained more effectively.

A travelling-wave tube amplifier according to a third aspect of the present invention is a travelling-wave tube amplifier comprising:

an electron gun emitting an electron beam;

a high frequency circuit causing interaction between the electron beam and an input high frequency signal to amplify the high frequency signal, and outputting an amplified high frequency signal;

a collector section including N (positive integer equal to or greater than 2) collector electrodes for capturing the electron beam to which velocity modulation is subjected in said high frequency circuit;

N collector leads, each lead respectively having one end thereof being electrically connected to any one of said N collector electrodes, and the other end thereof being electrically connected to a power source; and N×(N−1)/2 magnetic cores, each of said cores comprising a respective through hole, wherein selected two of said N collector leads pass through a one of said through holes in said magnetic cores, respective currents flowing through said selected two of said collector leads generate corresponding magnetic fluxes in said magnetic cores with directions which are reversed from each other, and combinations of said selected two of said collector leads passing through said through holes in said N×(N−1)/2 magnetic cores are different from each other.

According to this structure, the magnetic fluxes, which are generated in the magnetic core and whose directions are reversed from each other, cause induction currents to flow through the two collector leads through the though hole in the magnetic core. The directions of those induction currents are reversed from the directions of the currents which originally flow through the two collector leads through the through hole in the magnetic core. Therefore, those induction currents restrain unnecessary components in the whole structure from the travelling-wave tube to the power source caused by the electron beam which was subjected to velocity modulation. As a result, the travelling-wave tube amplifier functions stably with excellent frequency characteristics. Moreover, since the suitable number of magnetic cores corresponding to the collector electrodes and collector leads are given, the unnecessary components are restrained without failure because the number of the magnetic cores are satisfied for each of the collector leads.

In a first preferred embodiment for the travelling-wave tube amplifier according to the third aspect of the present invention, the power source applies a first voltage to said electron gun, applies a voltage higher than the first voltage to a furthest one of said collector electrodes which is further from said electron gun than any other collector electrode, and sequentially applies higher voltages to respective ones of said collector electrodes closer to said electron gun than said furthest one. This structure has advantage that electrons in the electron beam, whose energy conditions are different from each other because the electron beam is subjected to velocity modulation, are fully captured in accordance with the energy conditions.

In a second preferred embodiment for the travelling-wave tube amplifier according to the third aspect of the present invention, the selected two of said N collector leads pass through said magnetic core in opposite directions. This structure has advantage that the directions of the magnetic fluxes generated in the magnetic core by the two collector leads are reversed from each other, because the directions of the currents flowing through the two collector leads through the through hole in the magnetic core are reversed from each other.

In a third preferred embodiment for the travelling-wave tube amplifier according to the third aspect of the present invention, the selected two of said N collector leads pass through said one of said through holes in said magnetic cores a predetermined number of times. This structure has advantage that the range of frequencies in unnecessary components is adjustable in accordance with how many times the collector leads go through the through hole, thus, the unnecessary components can be restrained more effectively.

A magnetic core assembly according to a fourth aspect of the present invention is a magnetic core comprising:

a plurality of collector leads, each lead respectively having one end thereof being connected to a plurality of collector electrodes to which different voltages are applied and the other end thereof being connected to a power source; and a magnetic core comprising a through hole through which any two of the plurality of said collector leads pass, respective currents flowing through said two collector leads generate corresponding magnetic fluxes in said magnetic core with directions which are reversed from each other.

According to this structure, the magnetic fluxes, which are generated in the magnetic core and whose directions are reversed from each other, cause induction currents to flow through the two collector leads through the though hole in the magnetic core. The directions of those induction currents are reversed from the directions of the currents which originally flow through the two collector leads through the through hole in the magnetic core. Therefore, those induction currents restrain unnecessary components included in the two collector leads.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENT

First Embodiment

Figure 1:
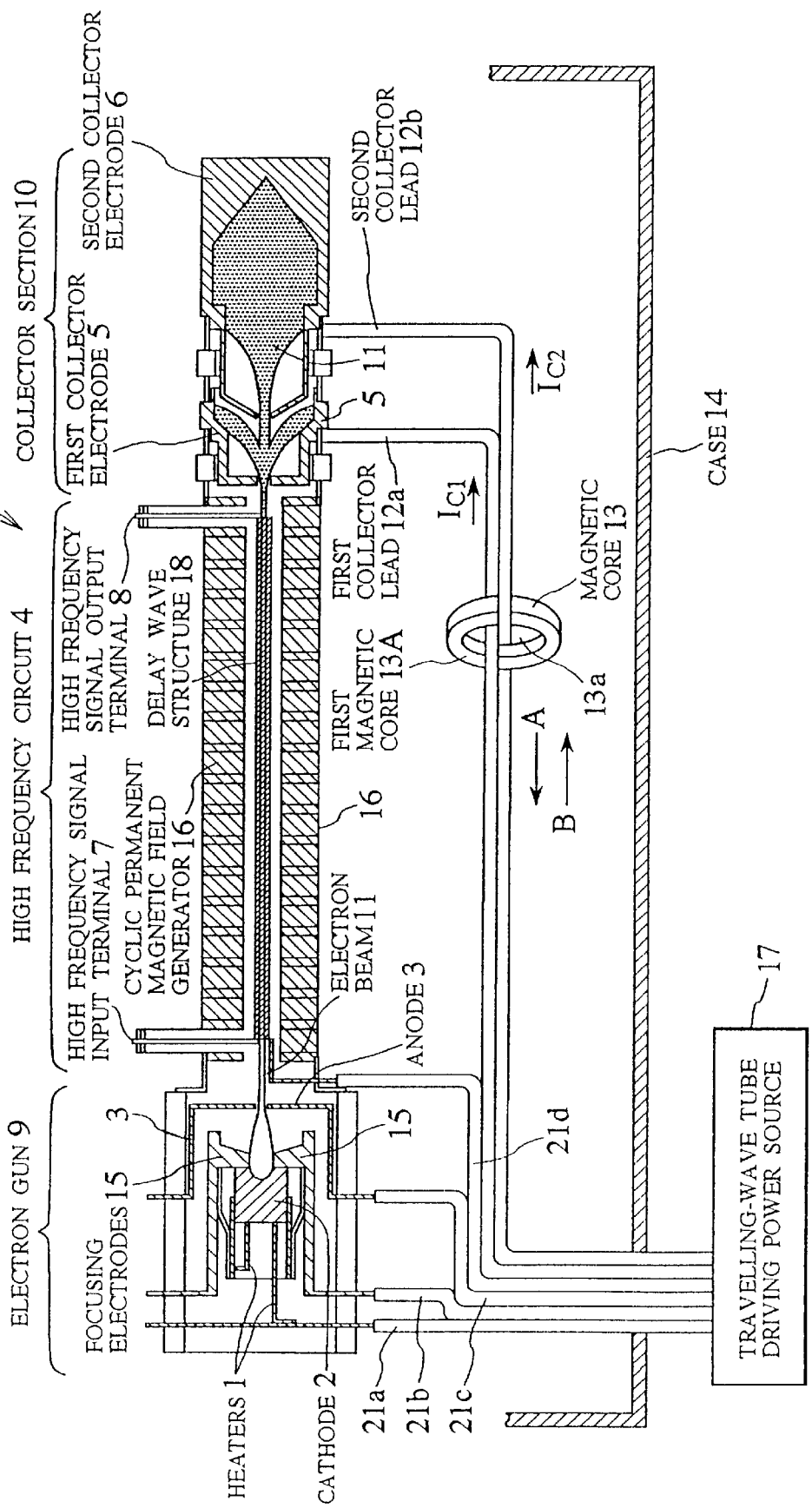
FIG. 1 is a schematic cross sectional view showing a travelling-wave tube amplifier according to a first embodiment of the present invention.

FIG. 1 is a schematic cross sectional view showing a travelling-wave tube amplifier according to a first embodiment of the present invention.

The structure of the travelling-wave tube amplifier shown in FIG. 1 will now be described first. The travelling-wave tube amplifier shown in FIG. 1 comprises, a dual-stage collector type travelling-wave tube (hereinafter referred to simply as a travelling-wave tube) 20, and a travelling-wave tube driving power source (hereinafter referred to simply as a power source) 17 for driving the travelling-wave tube 20. The travelling-wave tube 20 comprises an electron gun 9, a high frequency circuit 4, cyclic permanent magnetic field generators 16, and a collector section 10. The electron gun 9 has heaters 1, a cathode 2, a focusing electrode 15, and an anode 3. The high frequency circuit 4 has a high frequency signal input terminal 7, a high frequency signal output terminal 8, and a delay wave structure 18 including a helix conductor. The collector section 10 has a first and second collector electrodes 5 and 6.

One end of the heaters 1 (one end of heaters' winding) is electrically connected to the power source 17 via a lead 21a, and the other end thereof is electrically connected to the cathode 2. The cathode 2 and the focusing electrode 15 are electrically connected to each other, and they are electrically connected to the power source 17 via a lead 21b. The anode 3 and the high frequency circuit 4 are electrically connected to the power source 17 via a lead 21c and a lead 21d, respectively. The first and second collector electrodes 5 and 6 are electrically connected to the power source 17 via first and second collector leads 12a and 12b, respectively. The power source 17 supplies predetermined voltages to the heaters 1, the cathode 2, the focusing electrode 15, the anode 3, the high frequency circuit 4, and the first and second collector electrodes 5 and 6.

The travelling-wave tube 20 is housed in a case 14 for protection. The leads 21a, 21b, 21c and 21d and the first and second collector leads 12a and 12b are led to the outside of the case 14 and electrically connected to the power source 17.

The first and second collector leads 12a and 12b go through a through hole 13a in a magnetic core 13 which consists of a ferrite member having a ring-like cross section. In this embodiment, the direction from the collector section 10 to the power source 17 is referred to as the forward direction of the first and second collector leads 12a and 12b through the through hole 13a. In this case, the first collector lead 12a goes through the through hole 13a in the direction indicated by an arrow A, that is, the direction from one surface (hereinafter, referred to as a first surface) of the magnetic core 13, in which the through hole 13a is formed, to a back surface of the first surface (hereinafter, referred to as a second surface). And the second collector lead 12b goes through the through hole 13a in the direction indicated by an arrow B which is the reversed direction from the arrow A shown in FIG. 1, that is, the direction from the second surface to the first surface of the magnetic core 13. In FIG. 1, each of the first and second collector leads 12a and 12b goes through the through hole 13a once. However, the first and second collector leads 12a and 12b may be wound around the magnetic core 13 in order to go through the through hole 13a a plurality of times.

Generally, a negative high voltage is applied to the cathode 2 which is built into the electron gun 9, and ground voltages or voltages lower than the ground voltage are applied to the anode 3 and the high frequency circuit 4. A high frequency signal is input to the high frequency signal input terminal 7, and an amplified high frequency signal is output from the high frequency signal output terminal 8. Voltages higher than the voltage to be applied to the cathode 2 are applied to the first and second collector electrodes 5 and 6. The voltage to be applied to the first collector electrode 5 is set so as to be higher than the voltage to be applied to the second collector electrode 6.

Operations of the travelling-wave tube amplifier shown in FIG. 1 will now be described. In the travelling-wave tube amplifier shown in FIG. 1, the cathode 2 emits an electron beam 11. The anode 3 controls the emission, that is, the amount of the electron beam 11 to be emitted. The electron beam 11 emitted from the cathode 2 goes toward the delay wave structure 8 in the high frequency circuit 4 while being accelerated by a voltage between the cathode 2 and the high frequency circuit 4 (known as a helix voltage). At that time, an electron lens formed by the focusing electrode 15 focuses the electron beam 11 emitted from the cathode 2 so as to have a predetermined beam diameter.

In the high frequency circuit 4, the electron beam 11, which is maintained being focused by magnetic field generated by the cyclic permanent magnetic field generators 16, passes through the delay wave structure 18. The voltage applied to the cathode 2 is adjusted so that the speed of the high frequency signal in the axial direction (transmission direction) transmitting in the delay wave structure 18 is almost equal to speed of the electron beam 11 in the axial direction (forward direction). The electron beam 11 interacts with the high frequency signal in the delay wave structure 18, and energy of the electron beam 11 amplifies the high frequency signal. At that time, the electron beam 11 which energizes the high frequency signal is subjected to velocity modulation.

In a case where the input high frequency signal consists of a single signal wave, the electron beam 11 passing through the delay wave structure 18 is subjected to velocity modulation in accordance only with the frequency component of the signal wave. In a case where the input high frequency signal consists of a plurality of signal waves whose frequencies are slightly different from each other, distortion waves appear in the delay wave structure 18 because of nonlinearity of the travelling-wave tube amplifier. Simultaneously, intermodulation waves having frequency components corresponding to the frequency difference between any two of the signal waves are generated because the plurality of signal waves are coherent to each other. Accordingly, the electron beam 11 is subjected to the velocity modulation in accordance with the frequency components of the plurality of signal waves, the distortion waves and the intermodulation waves respectively.

The electron beam 11 which passed through the delay wave structure 18 enters the collector section 10. After the velocity modulation, the electrons in the electron beam 11 have different energy conditions. Each of the electrons in the electron beam 11 is captured by the first collector electrode 5 or the second collector electrode 6 in accordance with the electron's energy condition. Then, collector currents IC1 and IC2 flow through the first and second collector leads 12a and 12b, respectively.

The flow directions of the collector currents IC1 and IC2 in the through hole 13a in the magnetic core 13 are reversed from each other, as indicated by arrows A and B. Therefore, the collector currents IC1 and IC2 generate magnetic fluxes in the magnetic core 13 whose directions are reversed from each other. Since the electron beam 11 entering the collector section 10 was subjected to the velocity modulation, the collector currents IC1 and IC2 include direct current component and modulated current component (ripple).

The modulated current component in the collector current IC1 generates a first inductive current at the second collector lead 12b through the magnetic core 13. The first inductive current at the second collector lead 12b generated by the collector current IC1 flows in the direction reversed from the flow direction of the collector current IC2. Therefore, the first inductive current generated by the collector current IC1 restrains the modulated current component included in the collector current IC2. On the contrary, the modulated current component in the collector current IC2 generates a second inductive current at the first collector lead 12a through the magnetic core 13. The second inductive current restrains the modulated current component included in the collector current IC1. Thus, the modulated current components in the collector currents IC1 and IC2 are restrained from returning to the power source 17.

The above described operations will now be described in detail with concrete numeric data. For example, the high frequency signal includes two signal waves f1 and f2 whose frequencies are slightly different from each other, that is, f1=10 GHz and f2=10.002 GHz. The electron beam 11 passing through the delay wave structure 18 is subjected to the velocity modulation corresponding to two signal waves (f1=10 GHz and f2=10.002 GHz), the distortion waves (2f1−f2=9.9998 GHz and 2f2−f1=10.004 GHz), and the intermodulation wave (Δf=f2−f1=2 MHz). This means that each of the collector currents IC1 and IC2 has the direct current component to which the modulated current component having frequency components of 9.998 GHz, 10 GHz, 10.002 GHz, 10.004 GHz and 2 MHz is superimposed. During a regular operation, the direct current component of the collector currents IC1 and IC2 is in the range of several tens mA to several hundreds mA generally, and the modulated current component having the above described frequency components is superimposed as ripple of several mA or lower.

At the magnetic core 13, the modulated current component having relatively low frequency such as 2 MHz is restrained. The number of the first and second collector leads 12a and 12b in the through hole 13a in the magnetic core 13, that is, the number of turns (windings) of the first and second collector leads 12a and 12b around the magnetic core 13 should be set to the minimum in the range of values which enable efficient restraint of the intermodulation waves in the high frequency signal. The suitable number of the turns is in the range of 1 to 5. In this case, the modulated current component having frequency components of 9.998 GHz, 10 GHz, 10.002 GHz and 10.004 GHz may return to the power source 17. However, since such the modulated current component has extremely high frequency, it seldom affects the operation of the power source 17.

As described above, the travelling-wave tube amplifier according to the first embodiment of the present invention restrain the modulated current component (unnecessary component) caused by the velocity modulation in the electron beam from returning to the power source. Since the unnecessary component is prevented from returning to the power source, operations of the power source is stable with excellent frequency characteristics.

Second Embodiment

Figure 2:
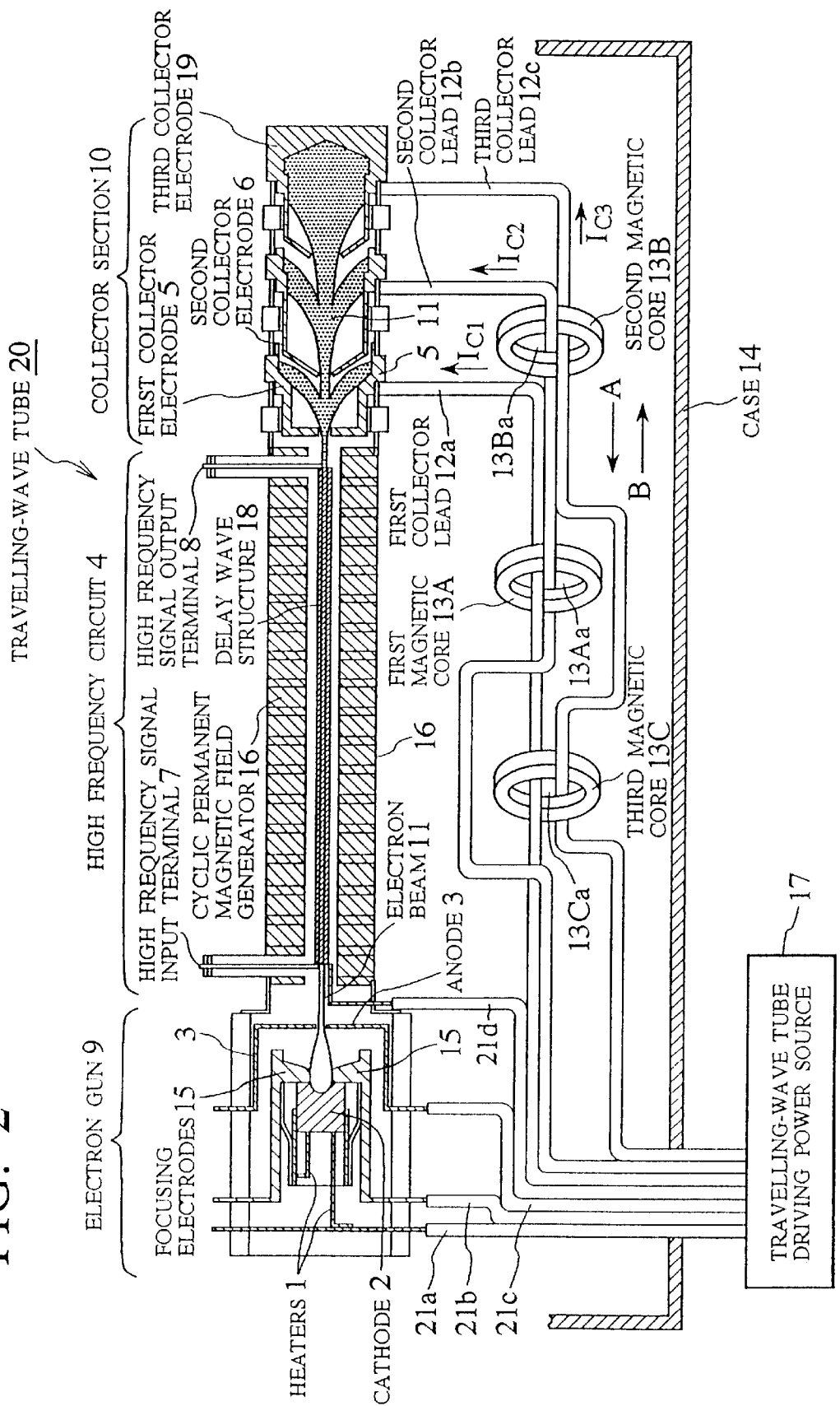
FIG. 2 is a schematic cross sectional view showing a travelling-wave tube amplifier according to a second embodiment of the present invention.

FIG. 2 is a schematic cross sectional view showing a travelling-wave tube amplifier according to a second embodiment of the present invention.

The structure of the travelling-wave tube amplifier shown in FIG. 2 will now be described first. The travelling-wave tube amplifier shown in FIG. 2 uses a triple-stage collector type travelling-wave tube 20 in order to realize improved energy conversion rather than the travelling-wave tube amplifier shown in FIG. 1. The structure of the triple-stage collector type travelling-wave tube 20 is similar to that of the dual-stage collector type travelling-wave tube 20 for the first embodiment shown in FIG. 1 except three collector electrodes are given. Like or the same reference numerals as used in FIG. 1 are also used in FIG. 2 to denote corresponding or identical components, and may not be described in detail herein.

The travelling-wave tube amplifier shown in FIG. 2 comprises a triple-stage collector type travelling-wave tube (hereinafter referred to simply as a travelling-wave tube) 20, and the travelling-wave tube driving power source (hereinafter referred to simply as a power source) 17 for driving the travelling-wave tube. The collector section 10 of the travelling-wave tube 20 has the first, second and a third collector electrodes 5, 6 and 19. The first, second and third collector electrodes 5, 6 and 19 are electrically connected to the power source 17 via the first, second and a third collector leads 12a, 12b and 12c, respectively. The power source 17 supplies predetermined voltages to the first, second and third collector electrodes 5, 6 and 19, respectively.

The first, second and third collector leads 12a, 12b and 12c go through through holes 13Aa, 13Ba and 13Ca in first, second and third magnetic cores 13A, 13B and 13C each of which consists of a ferrite member having a ring-like cross section. In this embodiment, the direction from the collector section 10 to the power source 17 is referred to as the forward direction of the first, second and third collector leads 12a, 12b and 12c through the through holes 13Aa, 13Ba and 13Ca. In this case, the first collector lead 12a goes through the through hole 13Aa in the direction indicated by an arrow A, that is, the direction from one surface (hereinafter, referred to as a first surface) of the magnetic cores 13A, 13B and 13C, in which the through holes 13Aa, 13Ba and 13Ca are formed, to a back surface of the first surface (hereinafter, referred to as a second surface). The second collector lead 12b goes through the through hole 13Ba in the direction indicated by an arrow B which is the reversed direction from the arrow A, that is, the direction from the second surface to the first surface of the magnetic cores 13A, 13B and 13C. And the third collector lead 12c goes through the through hole 13Ba in the direction indicated by the arrow A. Moreover, the third collector lead 12c goes through the through hole 13Ca in the direction indicated by the arrow B, the second collector lead 12b goes through the through hole 13Aa in the direction indicated by arrow B, and the first collector lead 12a goes through the through hole 13Ca in the direction indicated by the arrow A. Thus, each magnetic core 13A, 13B, and 13C has a pair of collector leads 12a, 12b and 12c passing through a through hole 13Aa, 13Ba, and 13Ca, defined therein respectively, and each possible pairing of the collector leads 12a, 12b, and 12c pass through one respective through hole 13Aa, 13Ba or 13Ca in opposite directions. In order that all possible pairings of N collector leads pass respectively through discrete through holes 13a in opposite directions, the number of magnetic cores 13 needed is {N×(N−1)/2}.

In FIG. 2, when going through one of the through holes 13Aa, 13Ba, or 13Ca, each of the first, second and third collector leads 12a, 12b and 12c goes through the through hole 13Aa, 13Ba or 13Ca once. However, the first, second and third collector leads 12a, 12b and 12c may be wound around the magnetic core 13 in order to go through the through holes 13Aa, 13Ba and 13Ca a plurality of times respectively.

Voltages higher than a voltage to be applied to the cathode 2 are applied to the first, second and third collector electrodes 5, 6 and 19. The voltage to be applied to the first collector electrode 5 is set higher than the voltage to be applied to the second collector electrode 6, and the voltage to be applied to the second collector electrode 6 is set higher than the voltage to be applied to the third collector electrode 19.

Operations of the travelling-wave tube amplifier shown in FIG. 2 will now be described. Basic functions of the travelling-wave tube amplifier for the second embodiment shown in FIG. 2 are almost the same as those of the travelling-wave tube amplifier for the first embodiment shown in FIG. 1. That is, the electron beam 11 emitted by the cathode 2 enters the delay wave structure 18 in the high frequency circuit 4 while being accelerated by a voltage between the cathode 2 and the high frequency circuit 4, and passes through the delay wave structure 18. The electron beam 11 interacts with the input high frequency signal in the delay wave structure 18, and the high frequency signal is amplified by energy of the electron beam 11. At that time, the electron beam 11 which energizes the high frequency signal is subjected to the velocity modulation.

The electron beam 11 which passed through the delay wave structure 18 enters the collector section 10. After the velocity modulation, the electrons in the electron beam 11 have different energy conditions. Each of the electrons in the electron beam 11 is captured by the first, second or third collector electrode 5, 6 or 19 in accordance with the electron's energy condition. Then, collector currents IC1, IC2 and IC3 flow through the first, second and third collector leads 12a, 12b and 12c respectively.

The flow directions of the collector current IC1 and IC2 in the through hole 13Aa in the first magnetic core 13A are reversed from each other, therefore, the collector currents IC1 and IC2 generate magnetic fluxes in the first magnetic core 13A whose directions are reversed from each other. Since the electron beam 11 entering the collector section 10 has been subjected to the velocity modulation, the collector currents IC1 and IC2 include direct current component and modulated current component (ripple).

The modulated current component in the collector current IC1 generates a first inductive current at the second collector lead 12b through the first magnetic core 13A. The first inductive current at the second collector lead 12b generated by the collector current IC1 flows in the direction reversed from the flow direction of the collector current IC2. Therefore, the first inductive current generated by the collector current IC1 restrains the modulated current component included in the collector current IC2. On the contrary, the modulated current component in the collector current IC2 generates a second inductive current at the first collector lead 12a through the first magnetic core 13A. The second inductive current restrains the modulated current component included in the collector current IC1.

At the second and-third magnetic cores 13B and 13C, the modulated current components are restrained in the same manner. Thus, the modulated current components in the collector currents IC1, IC2 and IC3 are restrained from returning to the power source 17.

In a case where the input high frequency signal consists of two signal waves whose frequencies are slightly different from each other, the modulated current component having frequency component of intermodulation waves caused by the two signal waves is restrained. The number of the first, second and third collector leads 12a, 12b and 12c in the through holes 13Aa, 13Ba and 13Ca in the magnetic cores 13A, 13B and 13C, that is, the number of turns (windings) of the first, second and third collector leads 12a, 12b and 12c around the magnetic cores 13A, 13B and 13C should be set to the minimum in the range of values which enables efficient restraint of the intermodulation waves in the high frequency signal. The suitable number of the turns is in the range of 1 to 5. In this case, the modulated current component having frequency components corresponding to the signal waves and distortion waves may return to the power source 17. However, since the modulated current component has extremely high frequency, it seldom affects the operation of the power source 17.

As described above, the travelling-wave tube amplifier according to the second embodiment of the present invention restrains the modulated current component (unnecessary component) caused by the velocity modulation in the electron beam from returning to the power source, as does the first embodiment. Since the unnecessary component is prevented from returning to the power source, the power source operates in a stable manner with excellent frequency characteristics.

The travelling-wave tube amplifier shown in FIG. 2 uses three magnetic cores. However, any one of the cores may be used. Nevertheless, for restraining unwanted effects of the unnecessary component in this case, it is preferable to use three magnetic cores as described.

This application is based on Japanese Patent Application No. H10-312012 filed on Nov. 2, 1998, and including specification, claims, drawings and summary. The disclosure of the above Japanese Patent Application is incorporated herein by reference in its entirety.

What is claimed is:

1. A travelling-wave tube amplifier comprising:
   a travelling-wave tube causing interaction between an electron beam and an input high frequency signal to amplify the high frequency signal and to cause a velocity modulation of the electron beam, said travelling-wave tube outputting an amplified high frequency signal;
   a plurality of collector electrodes capturing the electron beam, and being subjected to the velocity modulation of the electron beam;
   a plurality of collector leads electrically connecting each of said collector electrodes to a power source; and
   at least one magnetic core comprising a respective through hole,
   wherein any two of the plurality of said collector leads pass through said through hole in one of said magnetic cores, and
   respective currents flowing through said two collector leads passing through said through hole in said magnetic core generate corresponding magnetic fluxes in said magnetic core with directions which are reversed from each other.

2. The travelling-wave tube amplifier according to claim 1, wherein said power source applies a first voltage to an emission source of the electron beam, applies a voltage higher than the first voltage to one of said collector electrodes which is the furthest from said emission source of the electron beam, and sequentially applies higher voltages to respective ones of said collector electrodes which are closer to the emission source of the electron beam than said one collector electrode which is the furthest.

3. The travelling-wave tube amplifier according to claim 1, wherein of said any two of the plurality of said collector leads pass through said magnetic core in opposite directions.

4. The travelling-wave tube amplifier according to claim 1, wherein said any two of the plurality of said collector leads pass through said through hole in said magnetic core a predetermined number of times.

5. The travelling-wave tube amplifier according to claim 1, wherein said magnetic core has a ring-like cross section.

6. The travelling-wave tube amplifier according to claim 1, wherein said magnetic core includes a ferrite member.

7. A travelling-wave tube amplifier comprising:
   an electron gun emitting an electron beam;
   a high frequency circuit causing interaction between the electron beam and an input high frequency signal to amplify the high frequency signal, subjecting the electron beam to a velocity modulation, and outputting an amplified high frequency signal;
   a collector section including first and second collector electrodes for capturing the electron beam subjected to said velocity modulation;

first and second collector leads, each lead respectively having one end thereof being electrically connected with any one of said first and second collector electrodes while the other end thereof being electrically connected to a power source; and at least one magnetic core comprising a respective through hole, wherein each of said first and second collector leads passes through said through hole in one of said magnetic cores, and respective currents flowing through said first and second collector leads generate corresponding magnetic fluxes in said magnetic core with directions which are reversed from each other.

8. The travelling-wave tube amplifier according to claim 7, wherein said power source applies a first voltage to said electron gun, applies a voltage higher than the first voltage to a furthest one of said collector electrodes, said furthest one being the furthest collector electrode from said electron gun, and sequentially applies higher voltages to respective ones of said collector electrodes which are closer to said electron gun than said furthest one.

9. The travelling-wave tube amplifier according to claim 7, wherein said first and second collector leads pass through said magnetic core in opposite directions.

10. The travelling-wave tube amplifier according to claim 7, wherein each of said first and second collector leads pass through said through hole in said magnetic core a predetermined number of times.

11. A travelling-wave tube amplifier comprising:

an electron gun emitting an electron beam;

a high frequency circuit causing interaction between the electron beam and an input high frequency signal to amplify the high frequency signal, and outputting an amplified high frequency signal;

a collector section including N collector electrodes for capturing the electron beam to which velocity modulation is subjected in said high frequency circuit, where N is a positive integer equal to or greater than 2;

N collector leads, each lead respectively having one end thereof being electrically connected to any one of said N collector electrodes, and the other end thereof being electrically connected to a power source; and N×(N−1)/2 magnetic cores, each of said cores comprising a respective through hole, wherein selected two of said N collector leads pass through a one of said through holes in said magnetic cores, respective currents flowing through said selected two of said collector leads generate corresponding magnetic fluxes in said magnetic cores with directions which are reversed from each other, and combinations of said selected two of said collector leads passing through said through holes in said N×(N−1)/2 magnetic cores are different from each other.

12. The travelling-wave tube amplifier according to claim 11, wherein said power source applies a first voltage to said electron gun, applies a voltage higher than the first voltage to a furthest one of said collector electrodes, said furthest one being the furthest collector electrode from said electron gun, and sequentially applies higher voltages to respective ones of said collector electrodes which are closer to said electron gun than said furthest one.

13. The travelling-wave tube amplifier according to claim 11, wherein said selected two of said N collector leads pass through said magnetic core in opposite directions.

14. The travelling-wave tube amplifier according to claim 11, wherein said selected two of said N collector leads pass through said one of said through holes in said magnetic cores a predetermined number of times.

15. A magnetic core assembly comprising:

a plurality of collector leads, each lead respectively having one end thereof being connected to a plurality of collector electrodes to which different voltages are applied and the other end thereof being connected to a power source; and a magnetic core comprising a through hole through which any two of the plurality of said collector leads pass, respective currents flowing through said two collector leads generate corresponding magnetic fluxes in said magnetic core with directions which are reversed from each other.

* * * * *